(12) United States Patent
Romeo

(10) Patent No.: US 9,927,475 B2
(45) Date of Patent: Mar. 27, 2018

(54) METHOD AND DEVICE FOR NON-INVASIVELY DETERMINING THE USE OF NON-ELECTRICALLY CONDUCTIVE PLUMBING IN A RESIDENCE

(71) Applicant: Joseph Romeo, San Diego, CA (US)

(72) Inventor: Joseph Romeo, San Diego, CA (US)

(*) Notice: Subject to any disclaimer, the term of this patent is extended or adjusted under 35 U.S.C. 154(b) by 202 days.

(21) Appl. No.: 14/885,160

(22) Filed: Oct. 16, 2015

(65) Prior Publication Data
US 2016/0170064 A1 Jun. 16, 2016

Related U.S. Application Data

(60) Provisional application No. 62/090,697, filed on Dec. 11, 2014.

(51) Int. Cl.
*G01R 27/02* (2006.01)
*G01V 3/06* (2006.01)

(52) U.S. Cl.
CPC ............. *G01R 27/02* (2013.01); *G01V 3/06* (2013.01)

(58) Field of Classification Search
CPC .................................. G01R 27/02; G01V 3/06
See application file for complete search history.

(56) References Cited

U.S. PATENT DOCUMENTS

| | | | | |
|---|---|---|---|---|
| 5,744,962 A | * | 4/1998 | Alber | G01R 31/3627 324/426 |
| 2001/0001441 A1 | * | 5/2001 | Zdunek | G01B 5/066 205/791 |
| 2011/0121844 A1 | * | 5/2011 | Laepple | G01R 27/08 324/691 |
| 2013/0003501 A1 | * | 1/2013 | Marquez | G01M 3/18 367/83 |

* cited by examiner

*Primary Examiner* — Jermele M Hollington
*Assistant Examiner* — Feba Pothen
(74) *Attorney, Agent, or Firm* — Bodner & O'Rourke, LLP; Gerald T. Bodner; Christian P. Bodner

(57) ABSTRACT

A kit for non-invasively determining the presence of non-electrically conductive plumbing in a residence includes an electrical resistance measuring device having a main body and a resistance measuring circuit disposed therein and a display for indicating the value of the resistance measured by the resistance measuring circuit. The kit further includes at least two test probes which are in electrical communication with the resistance measuring circuit of the device. In a method for determining the presence of non-electrically conductive plumbing in the residence using the kit, one of the test probes is connected to an exposed portion of electrically conductive piping and the other is connected to a grounded conductor. When a low measured resistance is observed, as indicated by the device, the operator determines that the residence does not have non-electrically conductive plumbing. When a high measured resistance is observed, the operator determines that non-electrically conductive plumbing is present.

6 Claims, 11 Drawing Sheets

METHOD AND DEVICE FOR NON-INVASIVELY DETERMINING THE USE OF NON-ELECTRICALLY CONDUCTIVE PLUMBING IN A RESIDENCE

CROSS-REFERENCE TO RELATED APPLICATIONS

This application is based on U.S. Provisional Application Ser. No. 62/090,697, which was filed on Dec. 11, 2014, and is entitled "Method And Device For Non-Invasively Determining The Use of Non-Electrically Conductive Plumbing In A Residence", the disclosure of which is hereby incorporated by reference and on which priority is hereby claimed.

BACKGROUND OF THE INVENTION

Field of the Invention

The present invention generally relates to the detection of non-electrically conductive plumbing, and more particularly relates to a method and device for detecting the presence of polybutylene water piping in residences and structures.

Description of the Prior Art

Many residences and structures built in the 1980's and 1990's utilized plumbing systems comprising polybutylene water piping. Over the years, many of these homes experienced devastating losses due to polybutylene water pipes leaking and bursting. Polybutylene piping is now known to be defective and is no longer recognized as a suitable material for plumbing systems. Accordingly, detecting the presence of polybutylene piping within a structure is of the utmost importance, especially when purchasing, selling and repairing residences and structures.

Conventionally, polybutylene piping detection is completed by visual inspection; however, visual inspection is not always possible without partially demolishing existing structures such as walls. For example, in residences with an open basement ceiling, polybutylene piping behind the walls on the first floor of the residence may be detected by visually looking upwardly from the open basement into the enclosed wall spaces of the first floor. However, polybutylene piping present on the second floor of a residence may not be visible from the structure's basement. Similarly, in residences without a basement, visual detection of polybutylene piping may not be possible. Additionally, while in some residences and structures, non-polybutylene piping materials (e.g. copper for angle stops and shut off valves) extend outwardly from the walls and connect to appliances such as toilets and sinks, such a finding is not determinative of the absence of polybutylene piping. For example, it has been common practice for plumbers to externally connect non-polybutylene piping for appliances to the main polybutylene piping within the walls of the residence. Such a practice is often referred to as "stubbing out."

Since visual inspection is conventionally the only determinative way of detecting the presence or absence of polybutylene piping within a residence, in instances where direct visualization is not readily possible, inspectors and plumbers often must expose the enclosed spaces within the walls by demolishing portions to create inspection holes. In many situations, multiple inspection holes must be created in existing walling throughout the house to determine what portions of the house, if not all of the house, contain polybutylene piping. Such a practice is both expensive and impractical.

The present invention provides a novel method and apparatus for electrically detecting the presence of non-electrically conductive plumbing, such as polybutylene piping, in a residence without the need to destroy existing walling for visual detection.

OBJECTS AND SUMMARY OF THE INVENTION

It is an object of the present invention to provide a method for non-invasively determining the use of non-electrically conductive plumbing (e.g., plastic piping) in a residence.

It is another object of the present invention to provide a method of using the electrical characteristics of plumbing as a means to differentiate electrically conductive plumbing from non-electrically conductive plumbing.

It is still another object of the present invention to provide a device for non-invasively determining the presence of non-electrically conductive plumbing in a residence.

It is a further object of the present invention to provide a device for non-invasively determining the presence of non-electrically conductive plumbing in a residence that measures the resistance of a circuit defined by the plumbing system.

It is yet a further object of the present invention to provide a kit which includes a device and other components for non-invasively determining the presence of non-electrically conductive plumbing in a residence that is easily connectable to exposed piping and electrical connectors.

In accordance with one form of the present invention, a method for non-invasively determining the use of non-electrically conductive plumbing in a residence includes the steps of connecting a first test probe of a resistance measuring device to an exposed portion of conductive piping, which may be connected to non-electrically conductive (e.g., plastic) plumbing which is not exposed, connecting a second test probe of a resistance measuring device to a ground conductor and measuring the resistance between the first test probe and second test probe. It has been found that when a residential plumbing system is at least partially comprised of non-electrically conductive plumbing that may be hidden within the walls of the residence, a high resistance is measured in the circuit extending between an exposed portion of conductive piping and a grounded conductor, whereas a low resistance is measured when a residential plumbing system is comprised entirely of electrically conductive material (e.g., copper or iron piping).

To help carry out the method of the present invention, a device for non-invasively determining the presence of non-electrically conductive plumbing in a residence is disclosed herein. In one form, the device includes a main body which houses a circuit for measuring the resistance between two points, each of which is in contact with one of at least two testing probes in electrical communication with the resistance measuring circuit via a pair of terminals on the main body of the device. A display on the main body indicates the value of the resistance measured by the circuit when one of the test probes is in electrical communication with the exposed conductive piping and one of the test probes is in electrical communication with a grounded conductor. The display indicates a low resistance measurement when the plumbing system being surveyed is comprised entirely of electrically conductive material and indicates a high resistance measurement when the plumbing system is at least partially comprised of non-electrically conductive piping.

The resistance measuring device and the test probes may form part of a kit used by the inspector to perform tests on the plumbing of the residence to determine if some or all of the plumbing includes non-electrically conductive (e.g., plastic) piping. The kit may be conveniently held in a carrying case for transportation by the inspector from one residence to another residence.

These and other objects, features and advantages of the present invention will be apparent from the following detailed description of illustrative embodiments thereof, which is to be read in connection with the accompanying drawings.

DETAILED DESCRIPTION OF THE PREFERRED EMBODIMENTS

Figure 1:
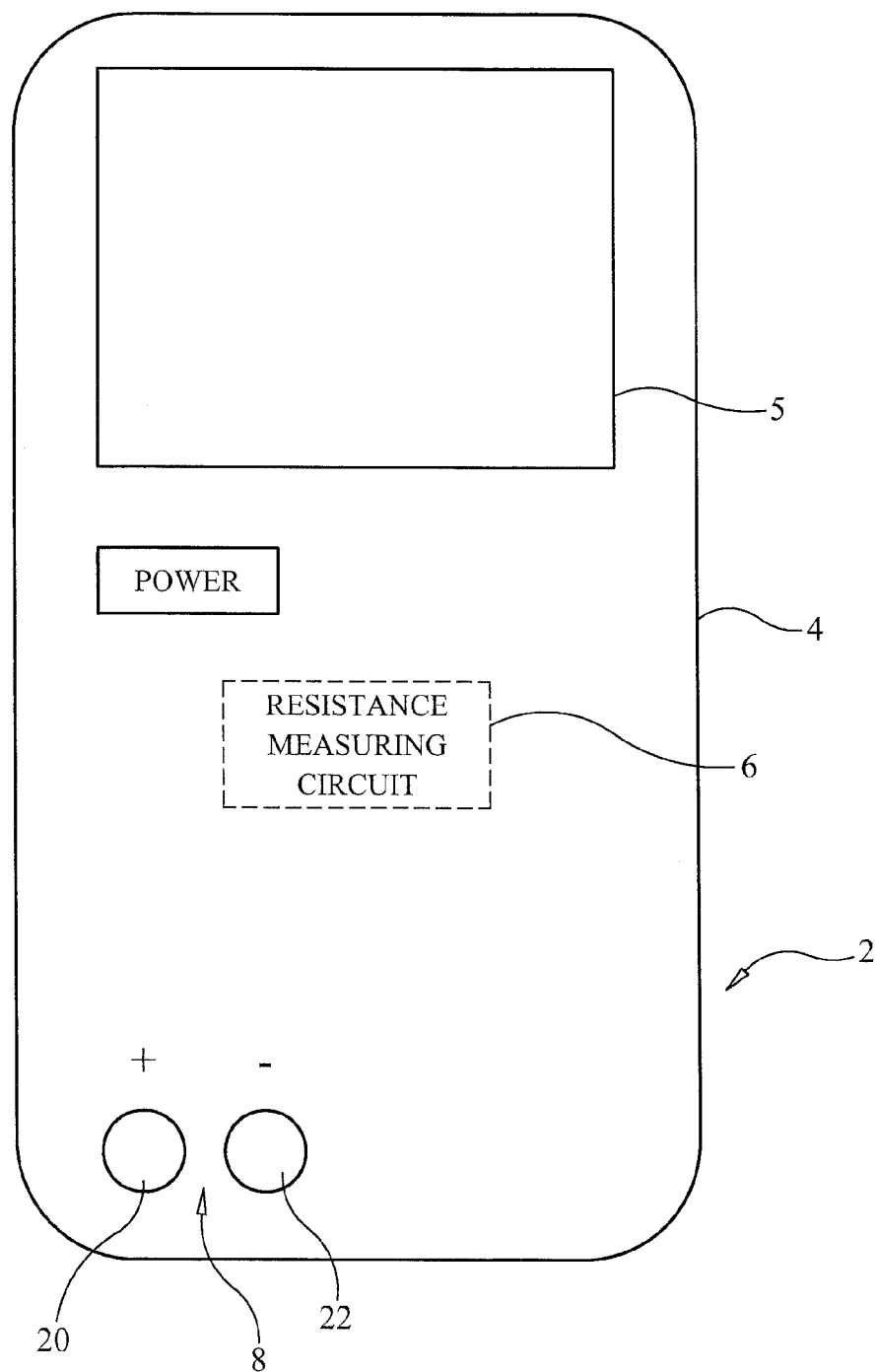
FIG. 1 is a front view of the device for non-invasively determining the presence of non-electrically conductive plumbing in a residence formed in accordance with the present invention.

A preferred form of the method of the present invention, and the device utilized to implement the method, will now be described. In accordance with one form of the present invention, a device 2 for non-invasively determining the presence or absence of non-electrically conductive plumbing in a residence includes a main body 4 having a circuit 6 therein which measures electrical resistance between two points, the circuit 6 being electrically coupled to a display 5 for displaying the measured resistance to a user. Such a device is commonly referred to as an ohmmeter, or may be incorporated in a device which can measure voltage (or current), such device being commonly referred to as a volt/ohmmeter (VOM) or multimeter. In a preferred form, device 2 is a volt/ohmmeter (VOM). The main body 4 also preferably includes at least two terminals 8 in electrical communication with the resistance measuring circuit 6 capable of receiving a plurality of testing probes 10. As will be described in greater detail in the forthcoming paragraphs, the testing probes 10 may be of varying lengths so that the device may be connected to conductive structures distant from the device 2. The ends 12 of the probes 10 are preferably engageable with the terminals 8 on the main body 4 so that once engaged, the probes 10 are in electrical communication with the resistance measuring circuit 6. A free end 14 of each of the probes 10, the free end 14 being opposite from the end 12 engaged with the terminal 8, may be positioned so as to be in communication with an electrically conductive material such as copper pipe or the ground terminal 16 of an electrical socket 18. As will be explained in greater detail, the resistance measuring circuit 6 in the device 2 may measure the electrical resistance between the conductive material in communication with the free ends 14 of the probes 10 to detect the presence of non-electrically conductive piping such as polybutylene or PEX (crosslinked polyethylene) within the walls of a residence.

Figure 2A:
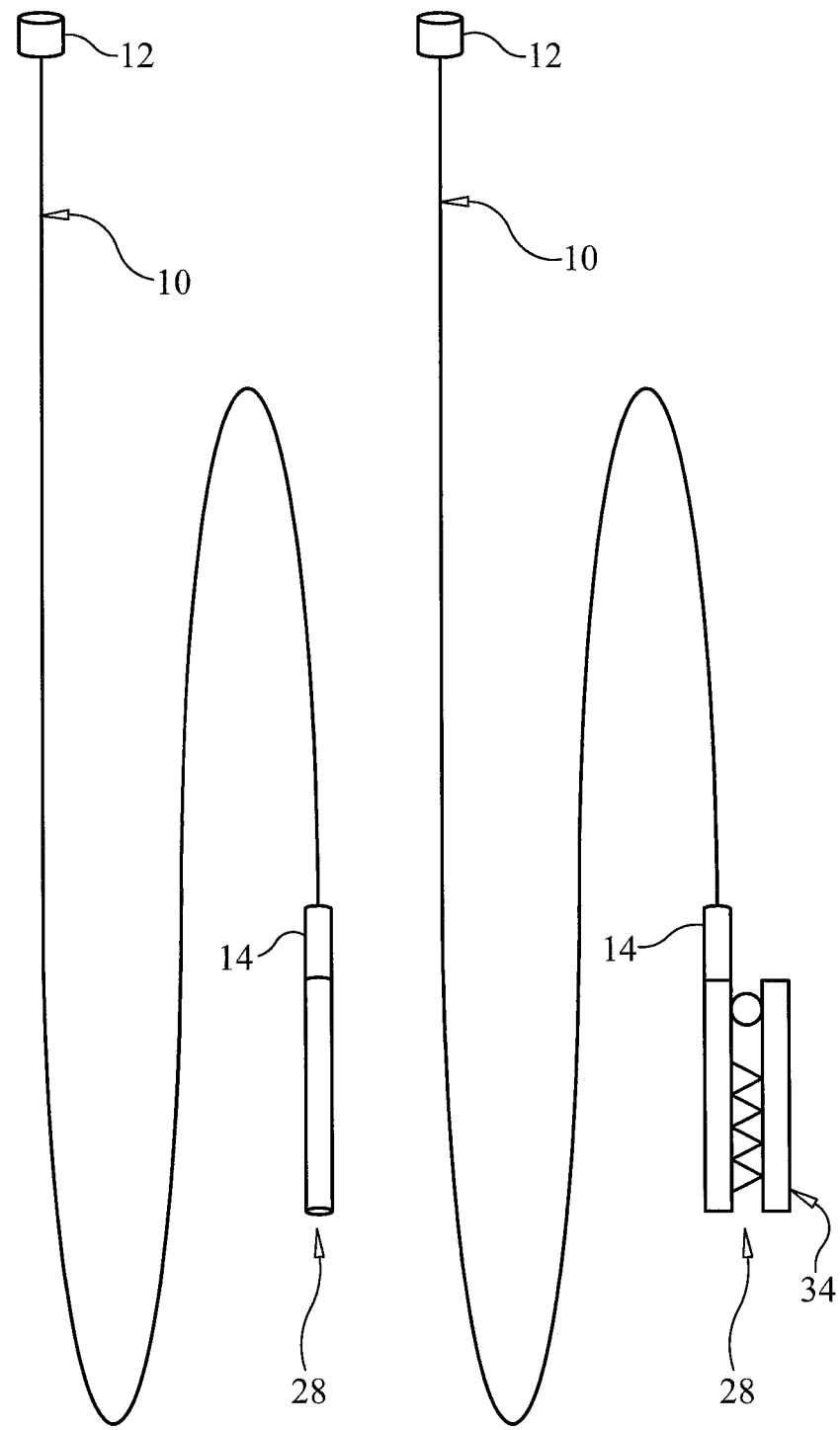
FIG. 2A is a side view of two forms of testing probes used in conjunction with the device for non-invasively determining the presence of non-electrically conductive plumbing in a residence formed in accordance with the present invention.
Figure 2B:
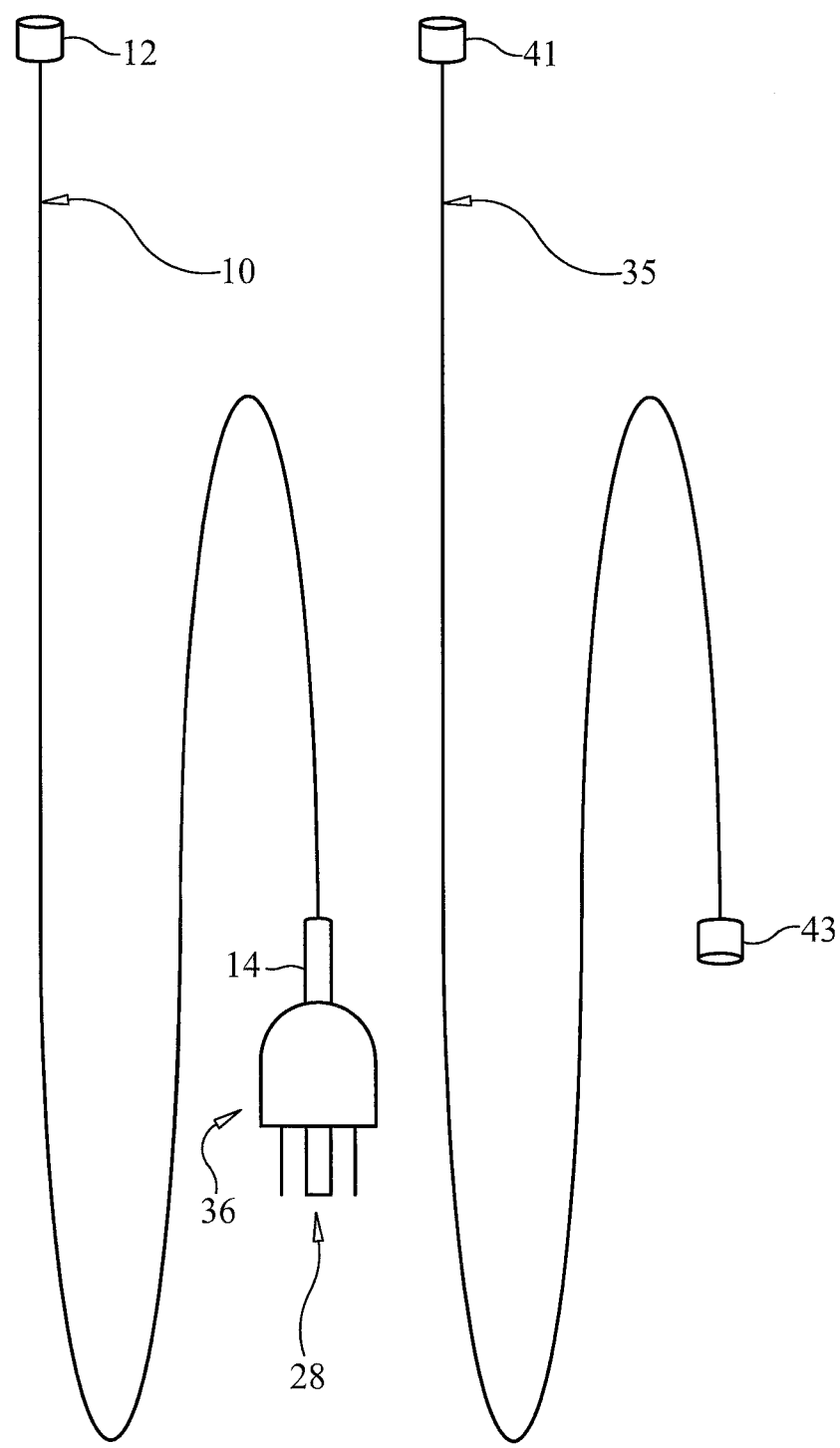
FIG. 2B is a side view of another form of a testing probe and an extender conductor used in conjunction with the device for non-invasively determining the presence of non-electrically conductive plumbing in a residence formed in accordance with the present invention.
Figure 3:
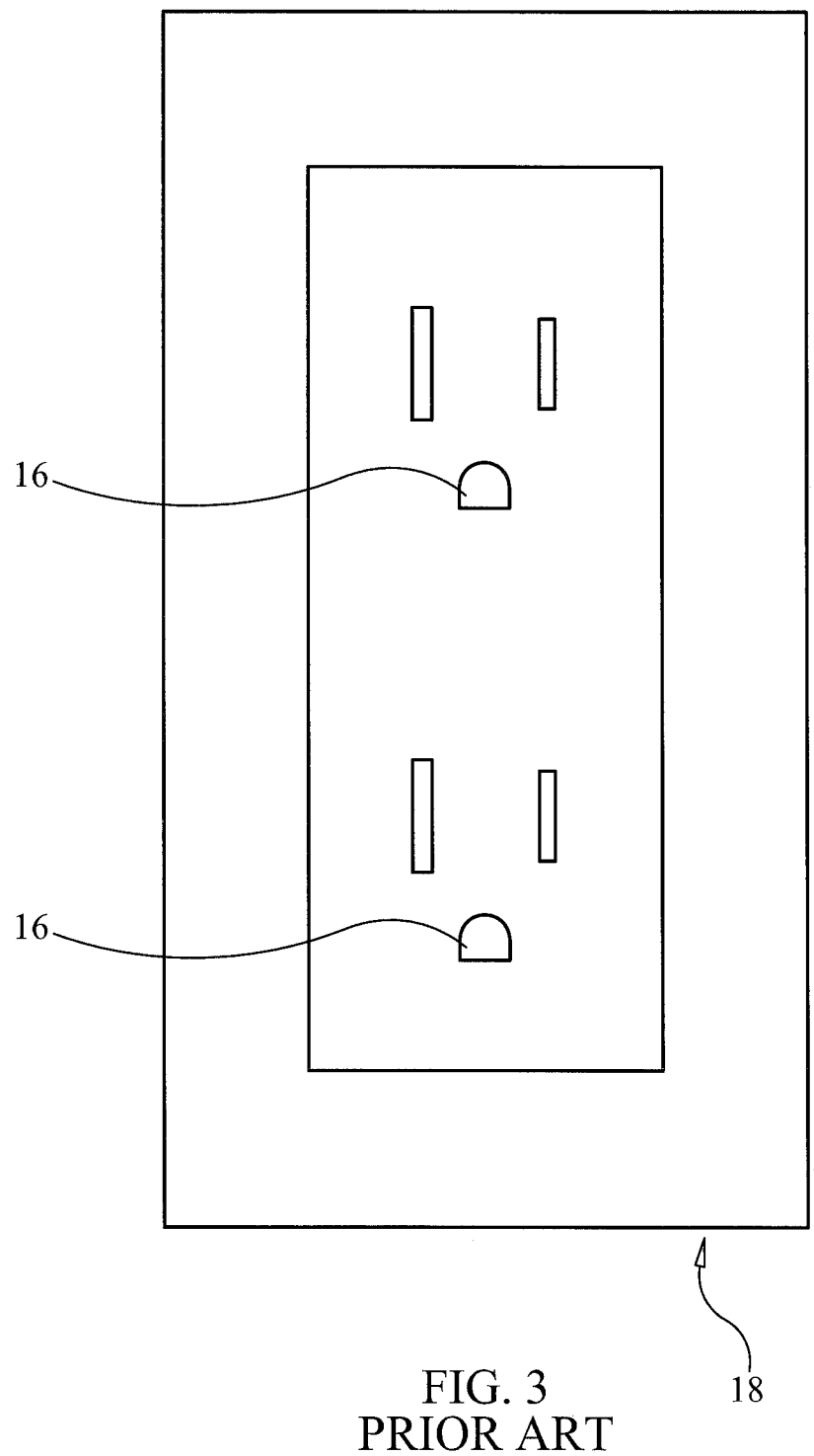
FIG. 3 is a front view of a conventional grounded electrical socket.
Figure 4:
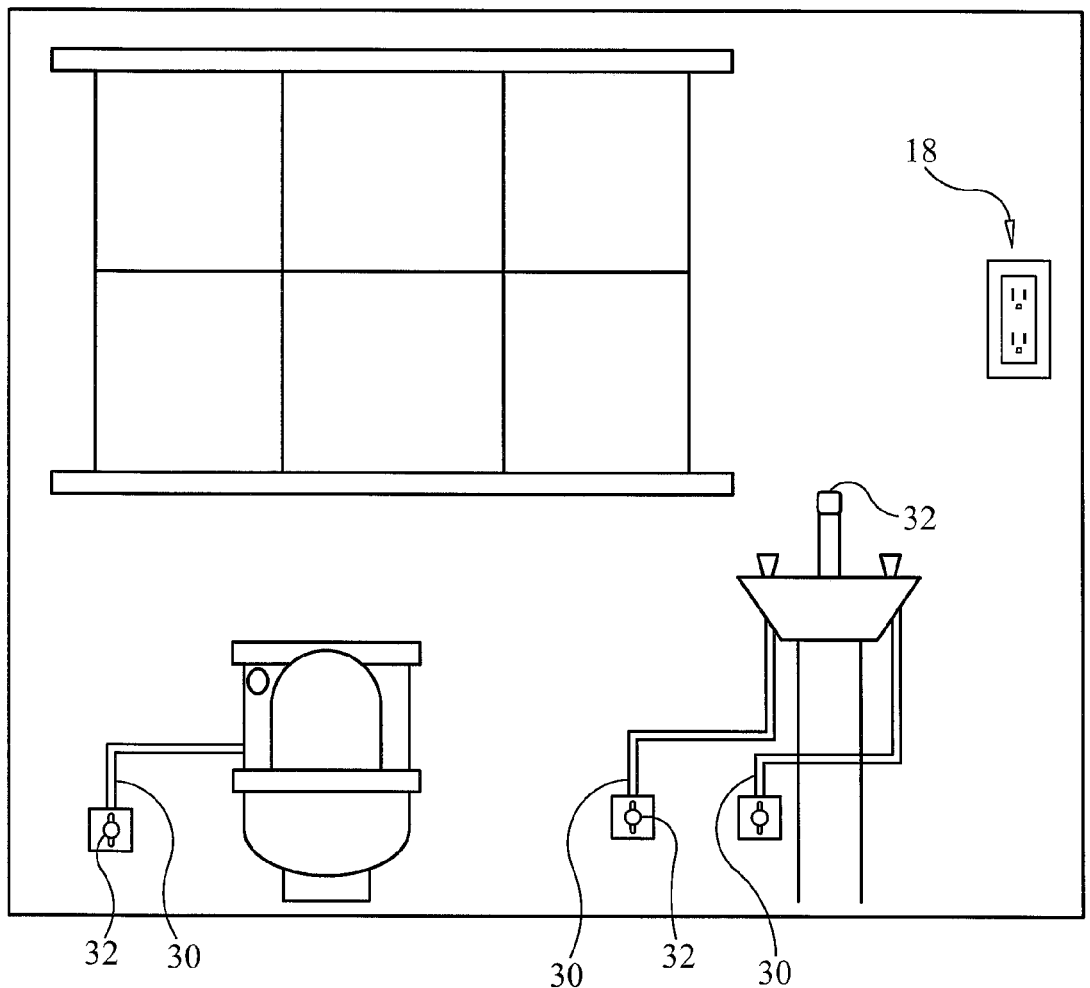
FIG. 4 is a front view of a bathroom, showing conventional external plumbing connected to a toilet and sink.
Figure 5:
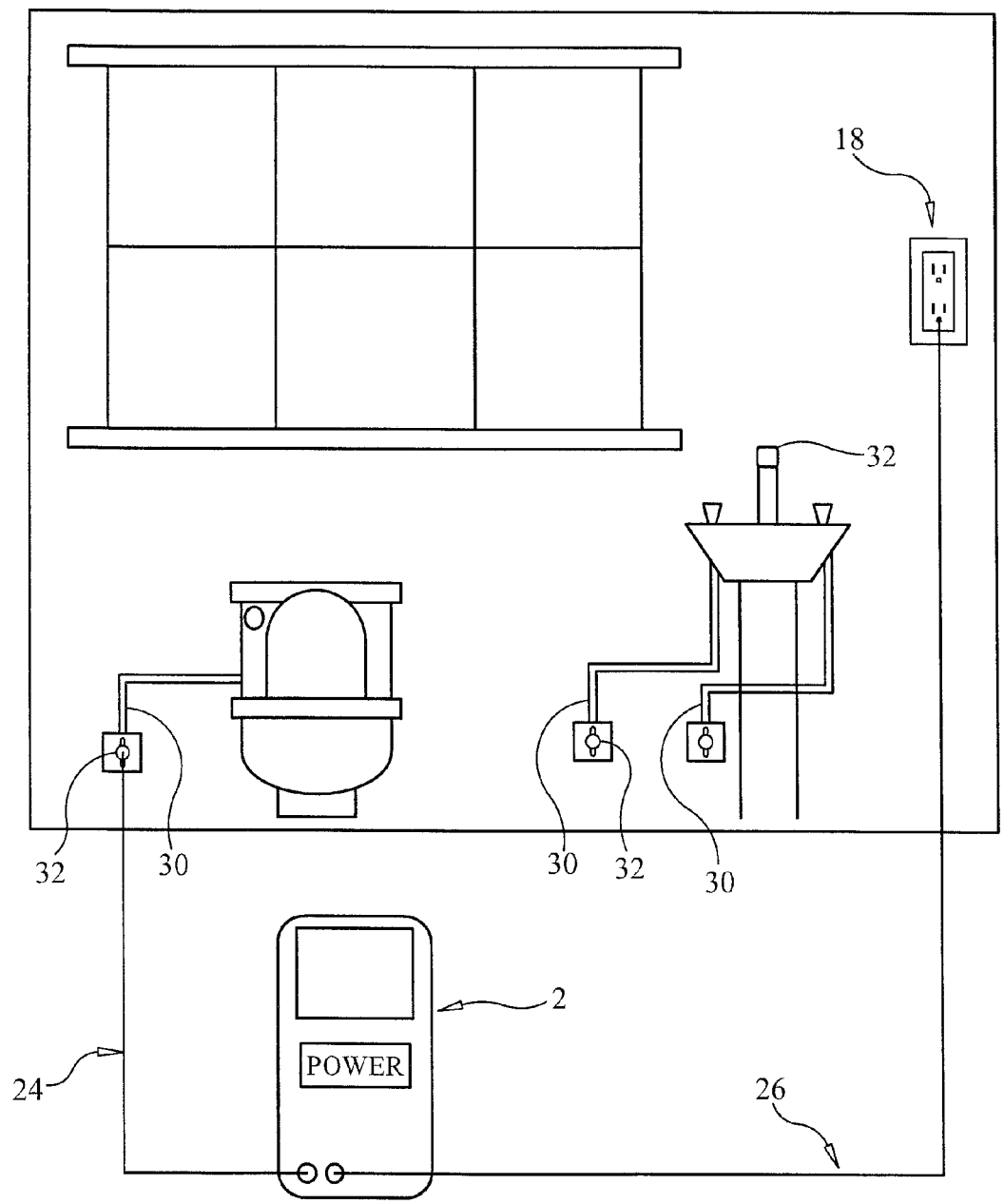
FIG. 5 is a front view of the device formed in accordance with the present invention, showing the positive testing probe in electrical communication with a conductive pipe and the negative testing probe in electrical communication with the ground terminal of a conventional wall electrical socket.
Figure 6:
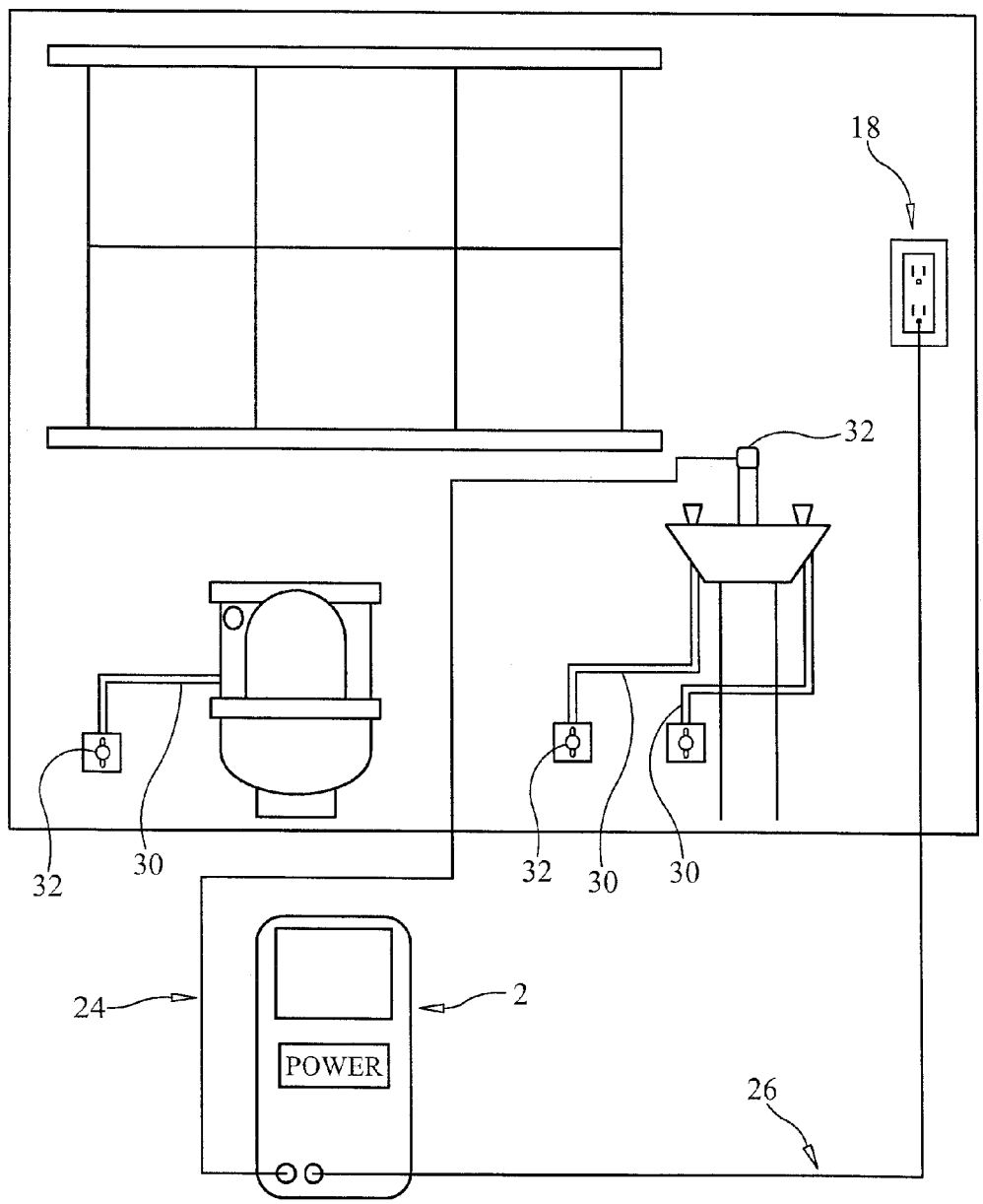
FIG. 6 is a front view of the device formed in accordance with the present invention, showing the positive testing probe in electrical communication with a conductive fixture of a sink and the negative testing probe in electrical communication with the ground terminal of a conventional wall electrical socket.

The device 2 preferably includes two terminals: a positive terminal 20 and a negative or common (COM) terminal 22. The positive and common terminals 20, 22 are preferably in electrical communication with the input terminals (not shown) of the resistance measuring circuit 6 therein. Two probes, a positive testing probe 24 (usually colored red) and a negative testing probe 26 (usually colored black) may be engageable with the positive and common terminals 20, 22 on the device 2, respectively. As shown in FIGS. 2A and 2B of the drawings, the free ends 14 of the probes 10 may further include a connector 28 such as a clamp, alligator clip, plug or contact that may be engageable with an external conductive fixture such as copper plumbing or the ground terminal 16 of an electrical socket 18. Accordingly, when the connector 28 of the positive probe 24 is in electrical communication with exposed conductive piping 30 and the connector 28 of the negative probe 26 is in electrical communication with the ground terminal 16 of an electrical socket 18, the resistance measuring circuit 6 of the device 2 in electrical communication with the testing probes 24, 26 may measure the electrical resistance between the points with which the two probes are in contact.

Figure 7:
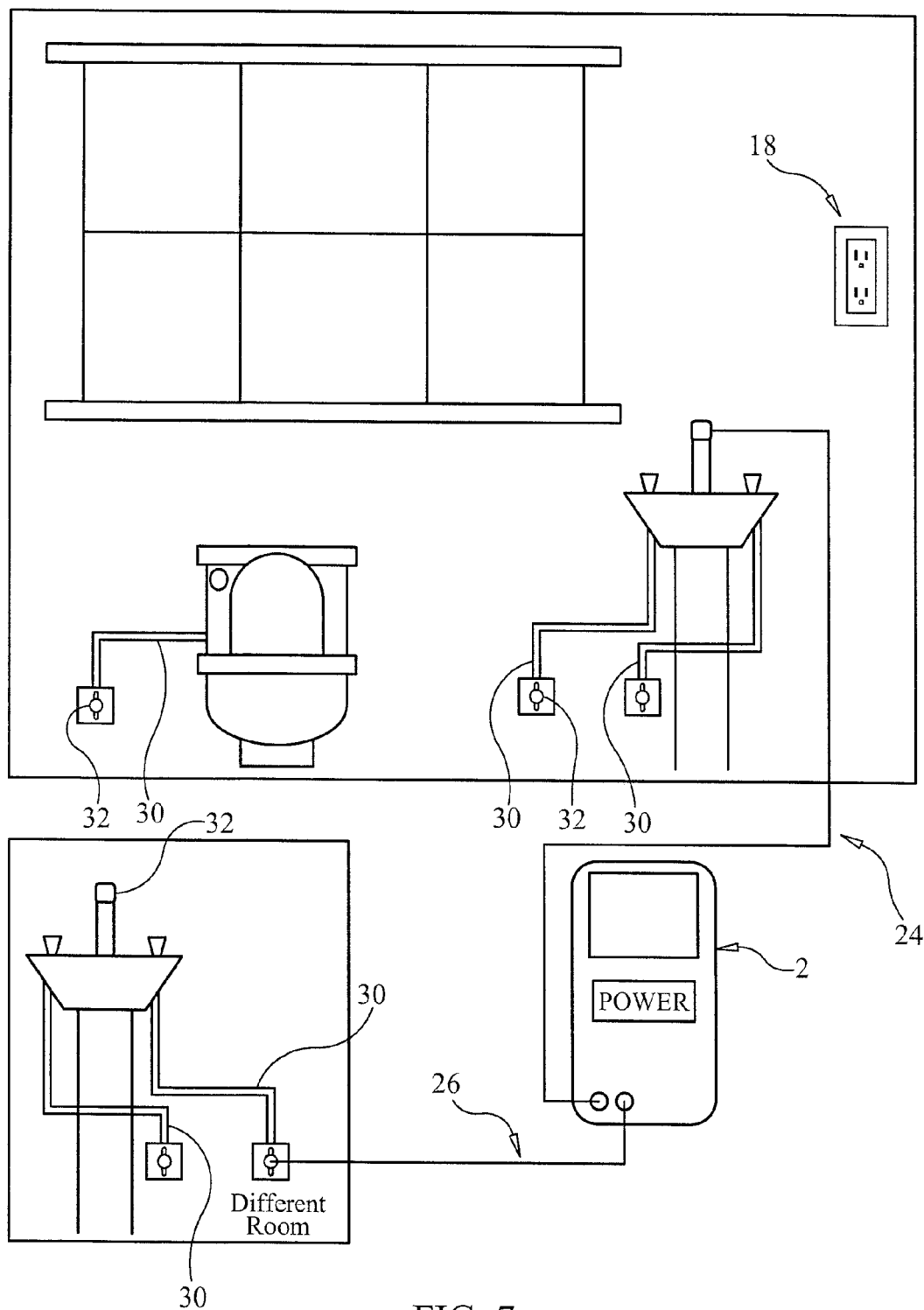
FIG. 7 is a front view of the device formed in accordance with the present invention, showing the positive testing probe in electrical communication with a conductive fixture of a sink and the negative testing probe in electrical communication with a conductive pipe in a different room used as an alternative ground.
Figure 8:
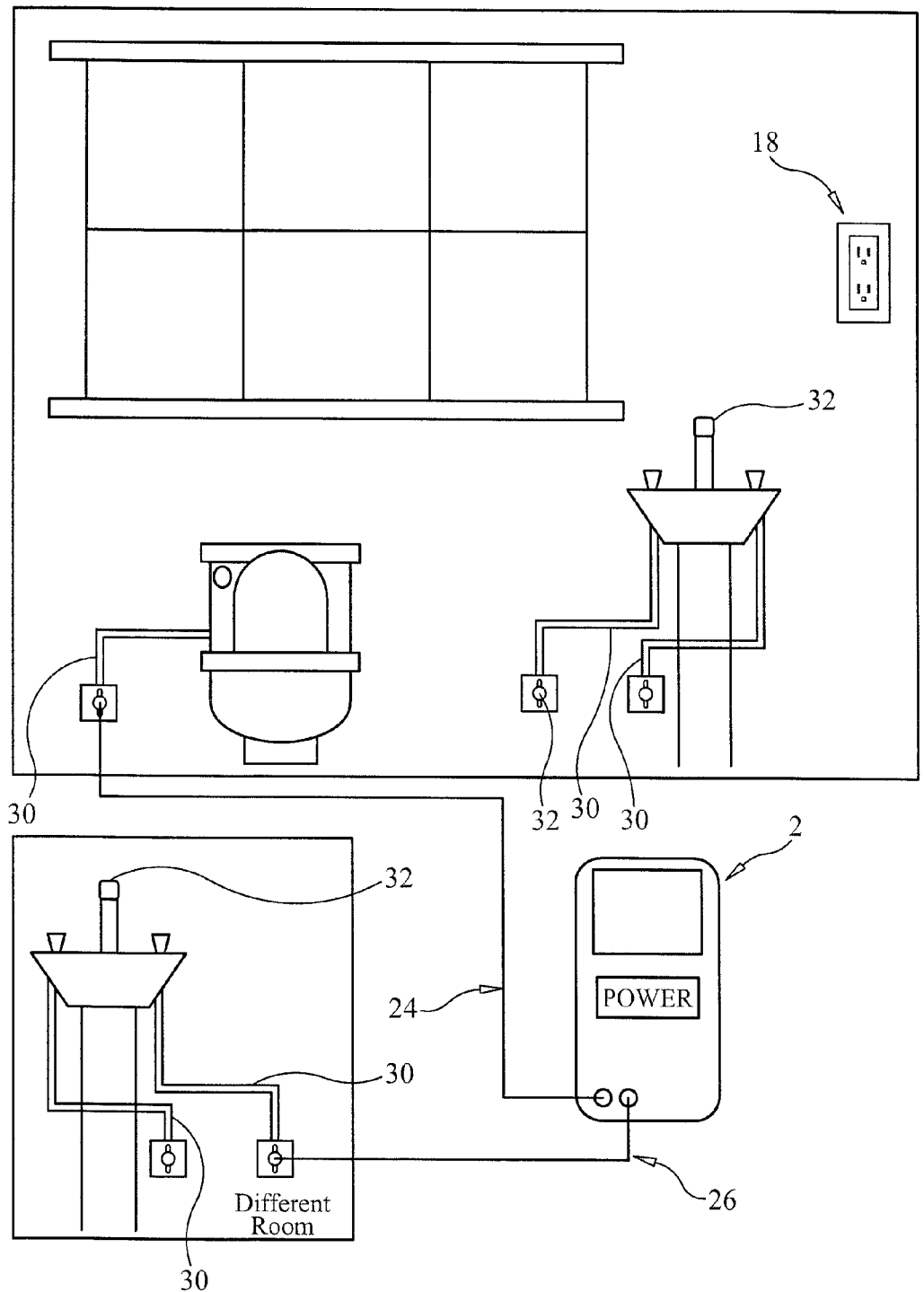
FIG. 8 is a front view of the device formed in accordance with the present invention, showing the positive testing probe in electrical communication with a conductive pipe connected to a toilet and the negative testing probe in electrical communication with a conductive pipe in a different room used as an alternative ground.

As will be explained, the measured resistance between the two probes 24, 26 may be used in determining the presence of non-electrically conductive plumbing such as polybutylene within a residence. More specifically, modern AC electrical systems within residences are typically grounded, meaning they are electrically connected to conductive piping or a grounding electrode in communication with the earth ground. Accordingly, the ground terminals 16 of electrical sockets 18 throughout a residence are also grounded, if correctly wired. Similarly, most plumbing systems are also grounded by some means and may be used as an alternate ground if the electrical socket wiring is unreliable, as shown in FIGS. 7 and 8 of the drawings. Accordingly, if a residence's plumbing system is entirely comprised of an electrically conductive material such as copper, when the resistance between the ground terminal 16 of an electrical socket 18 and a piece of the conductive piping 30 is measured, a relatively low resistance will be observed on the display 5 of device 2. Alternatively, if a residence's plumbing system is at least partially comprised of non-electrically conductive piping such as polybutylene, when the resistance between the ground terminal 16 of an electrical socket 18 and a piece of piping 30 connected in series to the non-electrically conductive piping is measured, a relatively high resistance will be observed on the display 5 of device 2. Thus, by measuring and observing the resistance between exposed conductive piping 30, or the conductive portions 32 of appliances connected thereto (e.g. faucets on sinks, water shut-off valves for toilets extending outwardly from a wall), and the ground terminal 16 of an electrical socket 18, non-electrically conductive piping such as polybutylene may be detected without the need for destructive visual inspection.

Accordingly, the present invention provides a method for detecting the presence of non-electrically conductive plumbing by utilizing the aforementioned detection device 2. First, an inspector connects the test probes 10 to the terminals 8 of the device. The inspector can select a variety of testing probes 10 having different lengths and connectors 28, as shown in FIGS. 2A and 2B of the drawings. For example, the inspector may utilize a negative testing probe 26 with a plug connector 36 that may be inserted into a wall electrical socket 18 in conjunction with a positive testing probe 24 having a clamp 34 that may be secured to exposed conductive piping 30. Alternatively, the inspector may utilize an elongated negative testing probe 26 with a clamp connector 34 that may be connected to conductive piping 30 in a more distant location, such as in a different room, as shown in FIGS. 7 and 8 of the drawings. The desired test probes 10 are engaged with the respective positive and negative terminals 20, 22 on the device 2. The free ends 14 of the test probes 10, opposite the ends 12 engaged with the terminals 8 on the device, are placed in communication with the exposed conductive piping 30 and the grounding material. More specifically, the inspector may connect the positive test probe 24 to conductive piping 30 such as copper piping extending from one of the residence's walls. Alternatively, the inspector may connect the positive test probe 24 to a conductive part 32 of an appliance such as the water faucet of a sink, or a water shutoff valve. The negative test probe 26 may then be plugged into the ground terminal 16 of a wall electrical socket 18. Of course, for safety reasons, the voltage on the ground terminal 16 of the electrical socket 18 should be measured with device 2 prior to undertaking a resistance measurement, and all power to the electrical socket 18 and, even more preferably, to the entire residence, should be shut off, if contact with an electrical socket 18 is to be made.

Once the connections between the test probes 24, 26 and the respective conductive surfaces are secure, the inspector may power on the device 2 wherein the circuit 6 of device 2 measures the resistance between points contacted by the positive and negative test probes 24, 26. An observed relatively high resistance is indicative of the presence of non-electrically conductive piping such as polybutylene. An observed relatively low resistance is indicative of the absence of non-electrically conductive piping. A high resistance measurement is typical of an open circuit whereas a low resistance measurement is typical of a closed circuit.

In accordance with the method and device of the present invention, the circuit is formed between the electrically conductive piping 30 and the ground through the device 2. If electrically conductive piping is utilized, the electrical circuit between the device 2 and the points contacted thereby is closed and a relatively low resistance will be observed on the display 5 of the device 2. If there is a break in the circuit between the two contacted points, for example from the use of non-conductive piping such as polybutylene, an open circuit will be present and a relatively high resistance will be observed on the display 5 of the device 2. The device 2, through its resistance measuring circuit 6 therein, utilizes the ground terminal 16 of a wall electrical socket 18 connected to the negative test probe 26 as a reference ground and utilizes the positive test probe 24 to test the connection between the conductive piping 30 and the reference ground. If there is a complete circuit (i.e. a good connection), a relatively low resistance measurement will be observed. However, if there is an incomplete circuit, such as when non-electrically conductive piping is utilized, a relatively high measured resistance will be observed due to the open circuit between the conductive piping 30 being tested and the ground.

Accordingly, an inspector may utilize the device and method of the present invention to systematically check a residence for the presence of non-electrically conductive piping. For example, the inspector may inspect the kitchen of a residence for non-electrically conductive piping by connecting the positive test probe 24 to the kitchen faucet (if the faucet is made of an electrically conductive material such as metal) and the negative test probe 26 to the ground terminal 16 of an electrical socket 18 and powering on the device 2 to measure the resistance between the points contacted by two test probes 24, 26. If the inspector observes a relatively high resistance on the device 2, the presence of non-electrically conductive piping such as polybutylene is likely. However, if the inspector observes a relatively low resistance, non-electrically conductive piping is not likely present. Similarly, as shown in FIGS. 7 and 8 of the drawings, if no reliably grounded electrical socket 18 is available, or as a back-up check, the inspector may utilize a negative test probe 26 having a clamp 34 and connect the test probe 26 to exposed conductive piping 30 in another room (i.e., a pipe-to-pipe resistance test). After the inspector has completed his analysis of the plumbing in the kitchen, the bathrooms may be checked. As in the kitchen, and as shown in FIGS. 4-8 of the drawings, the inspector may connect the positive test probe 24 to an electrically conductive bathroom fixture such as exposed conductive piping 30 (e.g. the water supply for a toilet) and connect the negative test probe 26 to the ground 16 of an electrical socket 18 or, if the electrical socket's ground is unreliable, a more distant room's exposed conductive piping 30 or conductive fixture 32 may be used as a connection point for the other probe 26, as shown in FIGS. 7 and 8 of the drawings.

Figure 9:
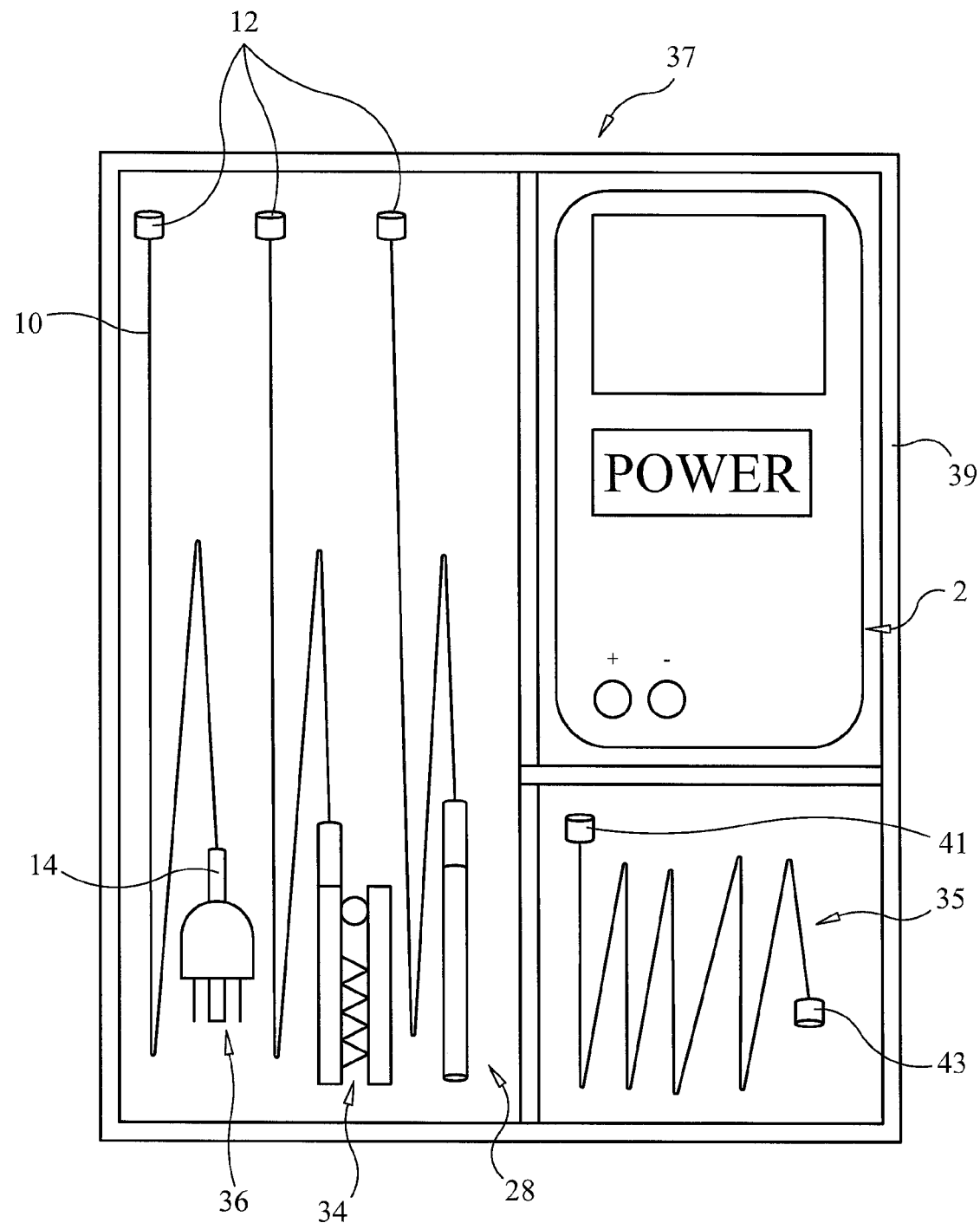
FIG. 9 is a top view of the kit for non-invasively determining the presence of non-electrically conductive plumbing, formed in accordance with the present invention, showing the components stored therein.
Figure 10:
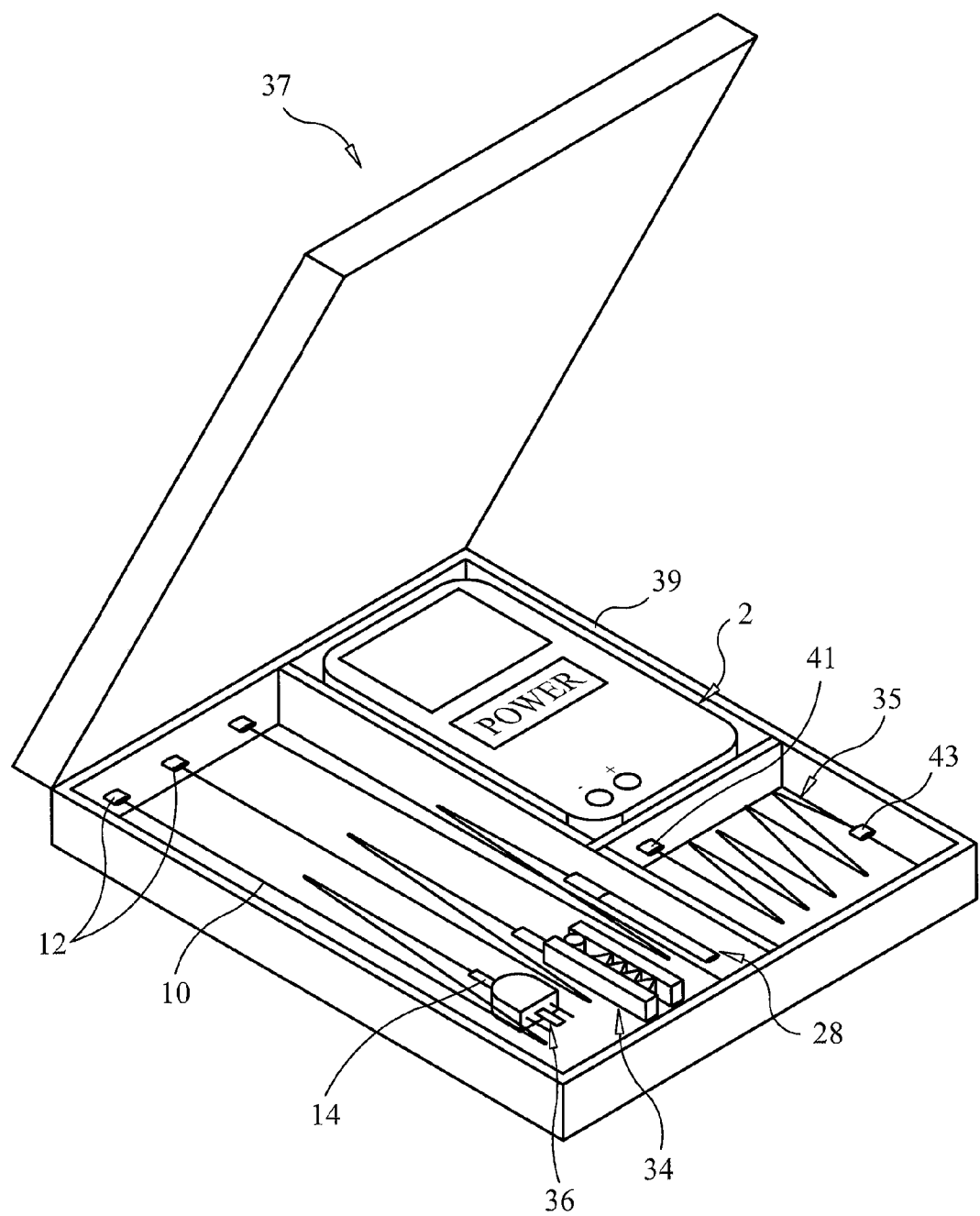
FIG. 10 is an isometric view of the kit for non-invasively determining the presence of non-electrically conductive plumbing, formed in accordance with the present invention.

The device 2 may be packaged with the probes 10 and the connectors 28 as a kit 37 for ready use by an inspector. More specifically, the kit 37 may include the resistance measuring device 2, a plurality of test probes 10 having varying wire lengths, including one or more with extended lengths to reach into different remote rooms of the residence from where the device 2 is located, and a set of different connectors 28, such as the clamp connector 34 and the plug connector 36, which are attachable to the free end 14 of the test probe 10 for the inspector to use when making a connection of the device 2 to an electrical socket 18 or plumbing fixture within the residence. The kit 37 may further include an extender conductor 35 having two opposite first and second ends 41, 43, the second end 43 being electrically coupleable to the first end of one of the test probes, and the first end 41 of the extender conductor 35 being attachable to the resistance measuring device 2 so as to be in electrical communication with the resistance measuring circuit of the device 2. The extender conductor 35 effectively lengthens the test probe to which it is connected so that the test probe may reach into other rooms of the residence that are remote from where the resistance measuring device 2 is located. The kit 37, preferably including some or all of the components mentioned above, may be held in a carrying case 39, as shown in FIGS. 9 and 10 of the drawings, for easy transportation and for organization of the kit components by the inspector.

By systematically inspecting a residence utilizing the device and method of the present invention, an inspector may reliably determine the presence or absence of non-electrically conductive piping such as polybutylene without the need to destroy existing wall structures to perform a visual inspection. Accordingly, the present invention provides a rapid and highly efficient method and device for performing inspections of a residence's plumbing system which is both low cost and reliable.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A kit for non-invasively determining the presence of non-electrically conductive plumbing, which comprises:
   an electrical resistance measuring device, which includes:
   a main body;
   a resistance measuring circuit, the resistance measuring circuit being positioned within the main body; and
   an indicator, the indicator being in electrical communication with the resistance measuring circuit, the indicator displaying a low resistance indication when a low resistance is measured by the resistance measuring circuit and a high resistance indication when a high resistance is measured by the resistance measuring circuit, the indicator being positioned on the main body of the device; and
   at least two testing probes, each of the testing probes having a first end and a second end disposed opposite the first end, the first ends of each of the testing probes being in electrical communication with the resistance measuring circuit;
   wherein at least one of the testing probes includes a clamp connector on the second end thereof, the clamp connector being configured to grip an electrically conductive structure; and
   wherein at least one of the testing probes includes a plug connector on the second end thereof, the plug connector configured to be receivable by a wall electrical socket.

2. A kit for non-invasively determining the presence of non-electrically conductive plumbing as defined by claim 1, which further comprises:
   an extender conductor, the extender conductor having a first end and a second end disposed opposite the first end, the second end of the extender conductor being electrically coupleable to the first end of one of the at least two testing probes, and the first end of the extender conductor being attachable to the electrical resistance measuring device so as to be in electrical communication with the resistance measuring circuit of the device.

3. A kit for non-invasively determining the presence of non-electrically conductive plumbing as defined by claim 1, wherein the indicator of the electrical resistance measuring device of the kit includes a display, the display indicating the numerical value of the resistance measured by the resistance measuring circuit.

4. A method for non-invasively determining the use of non-electrically conductive plumbing in a residence, which comprises the steps of:
   contacting a first test probe with at least a portion of exposed electrically conductive piping, the first test probe being in electrical communication with an electrical resistance measuring circuit within an electrical resistance measuring device;
   contacting a second test probe with a grounded conductor, the second test probe being in electrical communication with the resistance measuring circuit;
   measuring the electrical resistance between the first test probe and the second test probe with the resistance measuring circuit; and
   determining the presence of non-electrically conductive plumbing if the measured resistance is a first resistance and determining the absence of non-electrically conductive plumbing if the measured resistance is a second resistance, the second resistance being less than the first resistance.

5. A method for non-invasively determining the use of non-electrically conductive plumbing in a residence, as defined by claim 4, wherein the resistance measuring circuit displays the numerical value of the measured resistance on a display.

6. A method for non-invasively determining the use of non-electrically conductive plumbing in a residence, as defined by claim 4, wherein the resistance measuring circuit activates a high resistance indicator when the resistance measuring circuit measures the first resistance, and actives a low resistance indicator when the resistance measuring circuit measures the second resistance.

* * * * *